(12) United States Patent
Huang et al.

(10) Patent No.: US 8,148,766 B2
(45) Date of Patent: Apr. 3, 2012

(54) NONVOLATILE MEMORY CELL

(75) Inventors: Shin-Bin Huang, Hsinchu (TW);
Ching-Nan Hsiao, Kaohsiung (TW);
Chung-Lin Huang, Taoyuan (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 465 days.

(21) Appl. No.: 12/244,295

(22) Filed: Oct. 2, 2008

(65) Prior Publication Data

US 2010/0013062 A1    Jan. 21, 2010

(30) Foreign Application Priority Data

Jul. 21, 2008  (TW) ................................ 97127698 A

(51) Int. Cl.
*H01L 29/788* (2006.01)
(52) U.S. Cl. ................. 257/314; 257/315; 257/E21.209
(58) Field of Classification Search .................. 257/314, 257/315, E21.209

See application file for complete search history.

(56) References Cited

U.S. PATENT DOCUMENTS

| | | | |
|---|---|---|---|
| 6,706,599 B1 * | 3/2004 | Sadd et al. | 438/261 |
| 7,714,376 B2 * | 5/2010 | Lee et al. | 257/316 |
| 2002/0153555 A1 * | 10/2002 | Manabe et al. | 257/317 |
| 2004/0164340 A1 * | 8/2004 | Arai et al. | 257/315 |
| 2004/0253787 A1 * | 12/2004 | Lee et al. | 438/257 |
| 2005/0035393 A1 * | 2/2005 | Lung et al. | 257/314 |
| 2006/0102948 A1 * | 5/2006 | Chang et al. | 257/315 |
| 2006/0202255 A1 * | 9/2006 | Jeon et al. | 257/315 |
| 2007/0221981 A1 * | 9/2007 | Saeki | 257/314 |

* cited by examiner

*Primary Examiner* — Jerome Jackson, Jr.
*Assistant Examiner* — Paul Budd
(74) *Attorney, Agent, or Firm* — Volpe and Koenig, P.C.

(57) ABSTRACT

A nonvolatile memory cell is provided. A semiconductor substrate is provided. A conducting layer and a spacer layer are sequentially disposed above the semiconductor substrate. At least a trench having a bottom and plural side surfaces is defined in the conducting layer and the spacer layer. A first oxide layer is formed at the bottom of the trench. A dielectric layer is formed on the first oxide layer, the spacer layer and the plural side surfaces of the trench. A first polysilicon layer is formed in the trench. And a first portion of the dielectric layer on the spacer layer is removed, so that a basic structure for the nonvolatile memory cell is formed.

3 Claims, 5 Drawing Sheets

NONVOLATILE MEMORY CELL

FIELD OF THE INVENTION

The present invention relates to a nonvolatile memory cell, and more particularly to a vertical-type twin-bit nonvolatile memory cell.

BACKGROUND OF THE INVENTION

Flash memory is the main stream of nonvolatile memories and is mainly classified into two categories, namely NOR Flash and NAND Flash, wherein NAND Flash is particularly applied for mass data storage. In recent years, with the rise of various portable multimedia storage devices, the market demand for NAND Flash is increased significantly. Therefore, the research and development of the manufacturing process technique is continuously improved for shrinking the device dimension and enhancing the product reliability.

The conventional memory structure includes plane storage units formed on a silicon substrate and the manufacturing process is continuously repeated according to the designed layer number. Because of continuously repeated manufacturing process, the cost is high and cannot be easily reduced. At present, the structure and manufacturing process of the vertical-type nonvolatile memory cell have been developed in order to increase the memory cell density and enhance the integrity of the integrated circuit. Besides, the memory configuration, in which respective twin bits are stored in a memory cell, has advantages of low cost, fast write/read time and high density.

Please refer to FIG. 1, which is a schematic diagram showing a nonvolatile memory cell (which is a vertical-type twin-bit NAND memory cell) of the prior art. The nonvolatile memory cell includes a polysilicon control gate 17 and two polysilicon floating gates 11. Each of the floating gates 11 has a top on which a silicon nitride spacer layer 12 is disposed. An oxide-nitride-oxide (ONO) dielectric layer 16 is disposed between the control gate 17 and each of the floating gates 11. An oxide layer 13 is disposed between the control gate 17 and a silicon substrate 10. And an oxide channel 14 is disposed between the floating gates 11 and the silicon substrate 10.

The method for making the nonvolatile memory cell structured as above mainly includes the following steps. A silicon substrate 10 is provided. At least two polysilicon floating gates 11 serving as spacers are disposed above the silicon substrate 10, wherein each of the floating gates 11 has a top on which a silicon nitride spacer layer 12 is disposed, and a trench having a bottom and plural side surfaces is disposed. An ONO dielectric layer is deposited on the spacer layer 12, at the bottom of the trench and on the plural side surfaces of the trench. Anisotropic etching is performed for leaving a portion 16 of the ONO dielectric layer on the plural side surfaces of the trench. An oxide layer 13 is deposited at the bottom of the trench. A polysilicon control gate 17 is deposited in the trench. And etching back, deposition and polish etc are performed on the polysilicon control gate 17. However, dry etching, performed on ONO dielectric layer mentioned in a step of the above method of the prior art for making the vertical-type twin-bit NAND memory cell, is prone to produce a residual silicon nitride at corners of the plural side surfaces, and a problem that the gate oxide layer 13 of the produced memory cell has a thinner portion can occur. Therefore, the electrical characteristic and stability of the device are influenced.

SUMMARY OF THE INVENTION

It is an objective of the present invention to provide a method for making a nonvolatile memory cell, which includes the following steps. A semiconductor substrate is provided. A conducting layer and a spacer layer are sequentially disposed above the semiconductor substrate. At least a trench having a bottom and plural side surfaces is defined in the conducting layer and the spacer layer. A first oxide layer is formed at the bottom of the trench. A dielectric layer is formed on the first oxide layer, the spacer layer and the plural side surfaces of the trench. A first polysilicon layer is formed in the trench. And a first portion of the dielectric layer on the spacer layer is removed.

In the above-mentioned method, after the step the first portion of the dielectric layer on the spacer layer is removed, the following steps may be further included. A second oxide layer is formed on the first polysilicon layer. A second polysilicon layer is formed on the second oxide layer and the spacer layer. A portion of the second polysilicon layer on the spacer layer is removed (e.g. by chemically mechanical polishing (CMP) of the planarization polishing technology). The spacer layer is removed for exposing the conducting layer and a second portion of the dielectric layer on the plural side surfaces of the trench. A silicon nitride layer is formed on the second polysilicon layer, the exposed conducting layer and the exposed second portion of the dielectric layer. A portion of the silicon nitride layer on the second polysilicon layer and on the exposed conducting layer is removed. The second polysilicon layer is removed and the conducting layer is etched for spacing the nonvolatile memory cell. Besides, after the step the first polysilicon layer is formed, the first polysilicon layer 27 may be polished flat to stop to the position of the dielectric layer by CMP.

According to the above-mentioned method, an oxide channel is formed between the conducting layer and the semiconductor substrate. The spacer layer is made of a silicon nitride. And the dielectric layer is an oxide-nitride-oxide (ONO) layer.

Besides, the conducting layer is preferably made of a polysilicon and made into two floating gates of the nonvolatile memory cell. And the first polysilicon layer is made into a control gate of the nonvolatile memory cell.

It is another objective of the present invention to provide a method for making a nonvolatile memory cell, which includes the following steps. A semiconductor substrate is provided. At least two spacers are disposed above the semiconductor substrate, wherein each of the at least two spacers has a top. A spacer layer is disposed on the top of each of the at least two spacers. A first oxide layer is formed on the semiconductor substrate. A dielectric layer is formed on the first oxide layer and over the at least two spacers. A first polysilicon layer is formed between the at least two spacers. The first polysilicon layer is etched back for adjusting a height of the first polysilicon layer. And a first portion of the dielectric layer above the top of each of the at least two spacers is removed.

In the above-mentioned method, after the step the first portion of the dielectric layer on the spacer layer is removed, the following steps may be further included. A second oxide layer is formed on the first polysilicon layer. A second polysilicon layer is formed on the second oxide layer and above the at least two spacers. The second polysilicon layer above the at least two spacers is removed. The spacer layer is removed and the at least two spacers is etched for exposing a second portion of the dielectric layer. A silicon nitride layer is formed above the at least two spacers, the second polysilicon layer and the exposed second portion of the dielectric layer. A portion of the silicon nitride layer above the at least two spacers and the second polysilicon layer is removed. And the second polysilicon layer is removed and the at least two spacers are etched for spacing the nonvolatile memory cell.

According to the above-mentioned method, an oxide channel is formed between the semiconductor substrate and the at least two spacers. The spacer layer is made of a silicon nitride. And the dielectric layer is an ONO layer.

Besides, the at least two spacers are preferably made of a polysilicon and made into two floating gates of the nonvolatile memory cell. And the first polysilicon layer is made into a control gate of the nonvolatile memory cell.

It is still another objective of the present invention to provide a nonvolatile memory cell, which includes a semiconductor substrate, at least two spacers, a first oxide layer, a first polysilicon layer and a dielectric layer. The at least two spacers are disposed above the semiconductor substrate. Each of the at least two spacers has a top on which a spacer layer is disposed. The first oxide layer is disposed on the semiconductor substrate. The first polysilicon layer is disposed between the at least two spacers. The dielectric layer has a first portion disposed between the first oxide layer and a second portion deposed between the at least two spacers and the first polysilicon layer.

According to the above-mentioned nonvolatile memory cell, the nonvolatile memory cell may further include a second oxide layer and an oxide channel. The second oxide layer is disposed on the first polysilicon layer. The oxide channel is disposed between the semiconductor substrate and the at least two spacers.

According to the above-mentioned nonvolatile memory cell, the spacer layer is made of a silicon nitride and the dielectric layer is an ONO layer.

Besides, the at least two spacers are preferably made of a polysilicon and made into two floating gates of the nonvolatile memory cell. And the first polysilicon layer is made into a control gate of the nonvolatile memory cell.

In the prior art, a silicon substrate is provided; at least two polysilicon floating gates serving as spacers are disposed above the silicon substrate; an ONO dielectric layer is deposited on the at least two polysilicon floating gates. Afterwards anisotropic etching is performed for leaving a portion of the ONO dielectric layer on plural side surfaces of a trench. Afterwards an oxide layer and a control gate layer are sequentially deposited in the trench. Relatively describing, a method for making a nonvolatile memory cell is provided in the present invention. A semiconductor substrate is provided and at least two spacers are disposed above the semiconductor substrate to form at least a trench. A first oxide layer is deposited flush on the semiconductor substrate (i.e. at a bottom of the trench). Afterwards a dielectric layer is disposed on plural side surfaces of the trench, on the first oxide layer, and above the at least two spacers. Afterwards after a control gate layer is deposited, a portion of the dielectric layer above the at least two spacers is removed. In this way the problem, the gate oxide layer has a thinner portion, occurred in the prior art can be improved; in the meantime the disadvantage, a residual silicon nitride is prone to be produced at the corners of the plural side surfaces in the prior art while the primary step of dry etching is perform for leaving a portion of the dielectric layer on the plural side surfaces, can also be avoided.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Referring to FIGS. 2(A) to 2(M), a method for making nonvolatile memory cells according to an embodiment of the present invention is described as follows.

Figure 1:
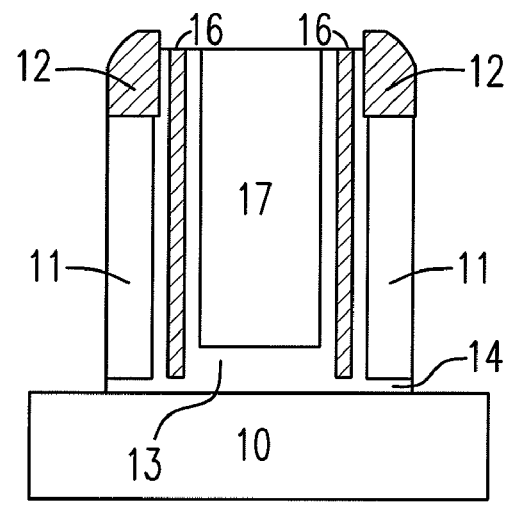
FIG. 1 is a schematic diagram showing a nonvolatile memory cell of the prior art.
Figure 2A:
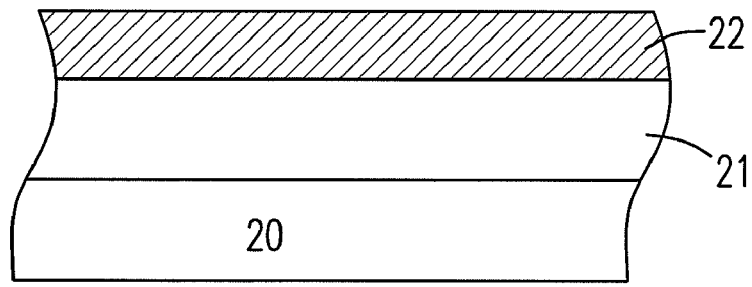
FIGS. 2(A) to 2(M) are schematic diagrams showing a method for making nonvolatile memory cells according to an embodiment of the present invention.

Firstly please refer to FIG. 2(A). A semiconductor substrate 20 is provided and is, e.g. a silicon substrate. A conducting layer 21 is formed on the semiconductor substrate 20 and a spacer layer 22 is formed on the conducting layer 21, wherein the spacer layer 22 may be made of a silicon nitride.

Figure 2B:
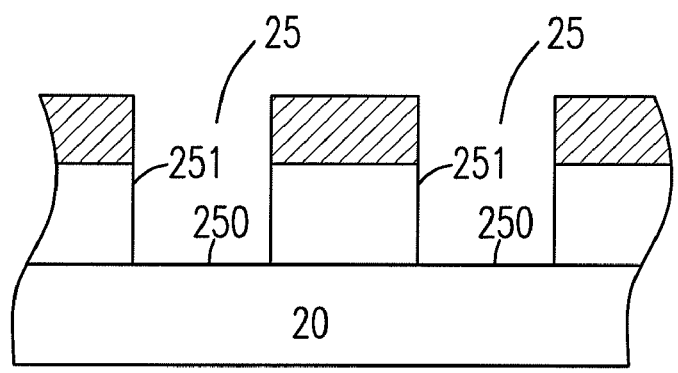

Afterwards please refer to FIG. 2(B). A portion of the spacer layer 22 and a portion of the conducting layer 21 are etched to reveal a top face of the semiconductor substrate 20 to form at least a trench 25. As shown, the trench 25 includes a bottom 250 and plural side surfaces 251.

Figure 2C:
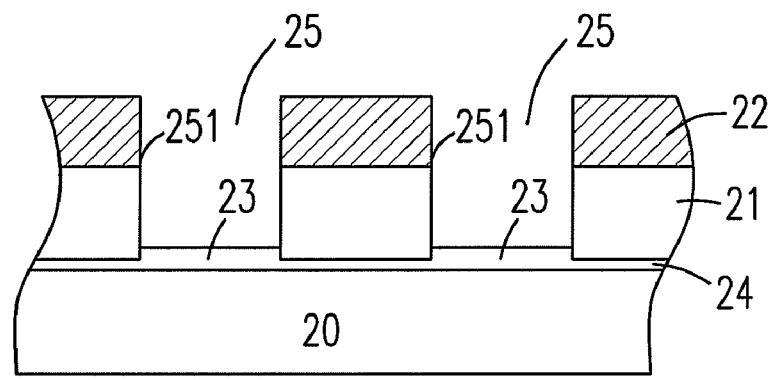

Afterwards please refer to FIG. 2(C). A first oxide layer 23 is formed at the bottom 250 of the trench 25. In the present embodiment, after an oxide layer is deposited by such as the chemical vapor deposition (CVD) method, a portion of the oxide layer on the plural side surfaces 251 is removed by such as etching for leaving the first oxide layer 23 at the bottom 250 of the trench 25. Therefore, the semiconductor substrate 20 will not be damaged in the deposition process; and the first oxide layer 23 is more uniform in comparison with the gate oxide layer of the prior art. In the meantime, an oxide channel 24 may also be formed between the semiconductor substrate 20 and the conducting layer 21. It is noted that the oxide channel 24 may be formed between the semiconductor substrate 20 and the conducting layer 21 right before the step the conducting layer 21 is formed on the semiconductor substrate 20, wherein the oxide channel 24 is, e.g. a silicon oxide channel 24.

Figure 2D:
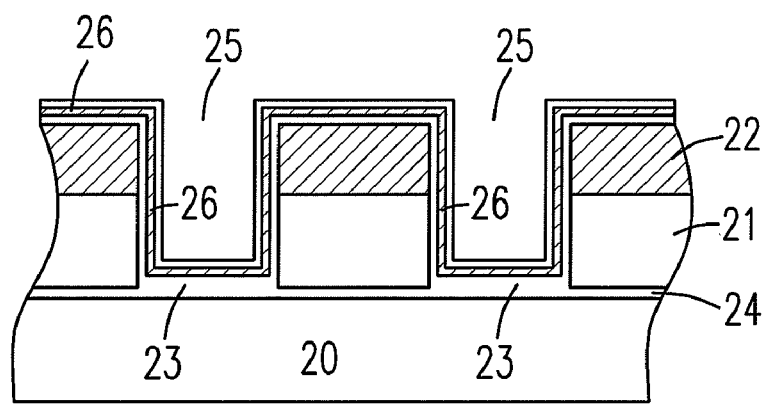
Figure 2E:
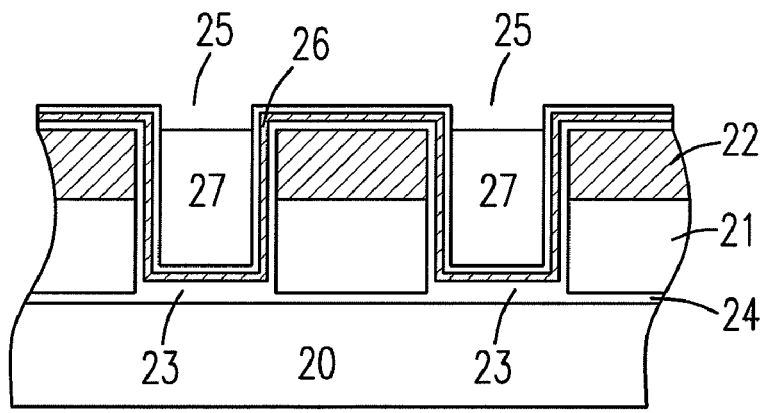
Figure 2F:
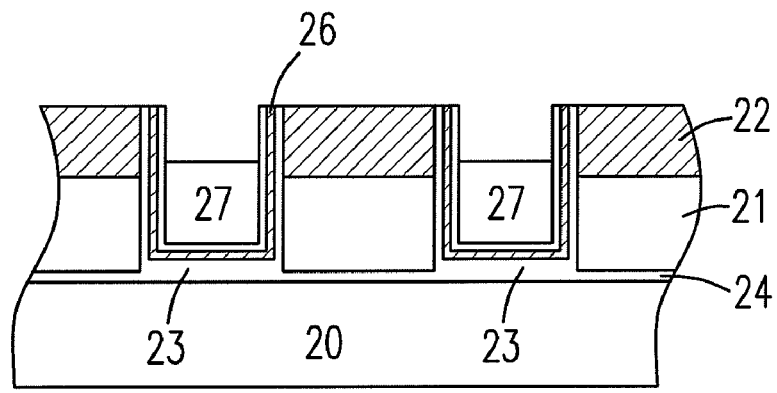
Figure 2G:
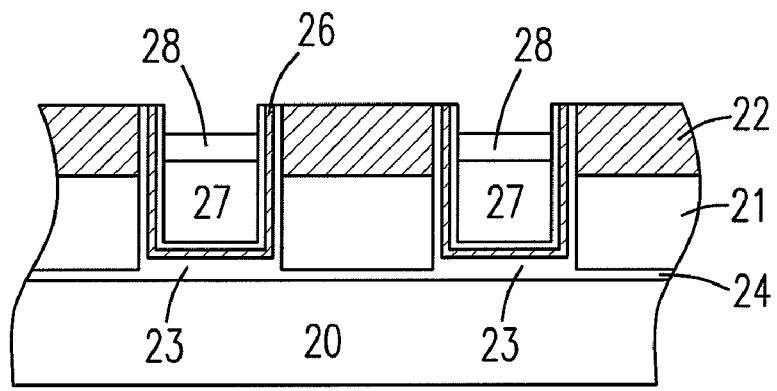
Figure 2H:
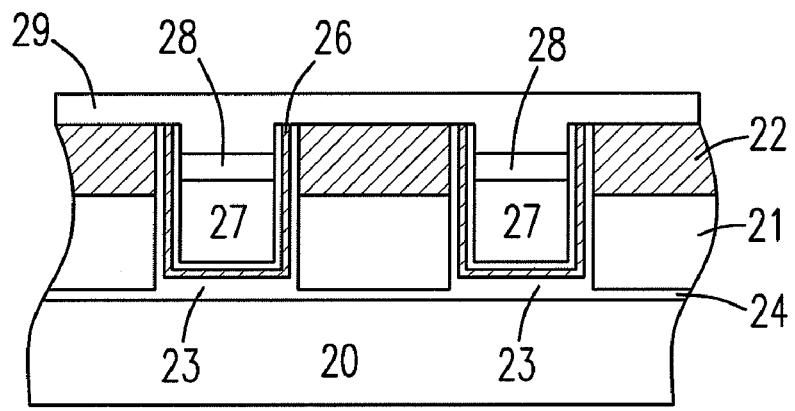

Afterwards please refer to FIGS. 2(D) to 2(F). After a dielectric layer 26 is conformally formed to cover the first oxide layer 23, the spacer layer 22 and the plural side surfaces 251 of the trench 25, a first polysilicon layer 27 is provided to fill the trench 25. The first polysilicon layer 27 is etched back for adjusting a height of the first polysilicon layer 27. A step that the first polysilicon layer 27 is polished for adjusting the height of the first polysilicon layer 27 may be performed before the step of etching back thereof; the first polysilicon layer 27 is polished flat, e.g. by performing CMP, to stop to the position of the dielectric layer 26. Finally anisotropic etching is performed for removing a portion of the dielectric layer 26 on the spacer layer 22, so that the basic structure of the nonvolatile memory cells of the present invention is formed as shown in FIG. 2(F).

In the above-mentioned embodiment, the dielectric layer 26 is, e.g. an ONO layer which may be made by the thermal oxidation method or the CVD method depositing a silicon oxide layer, a silicon nitride layer and a silicon oxide layer sequentially. Besides, the conducting layer 21 may be made of a polysilicon and made into two floating gate of each of the nonvolatile memory cells. And the first polysilicon layer 27 is made into a control gate of each of the nonvolatile memory cells.

Figure 2I:
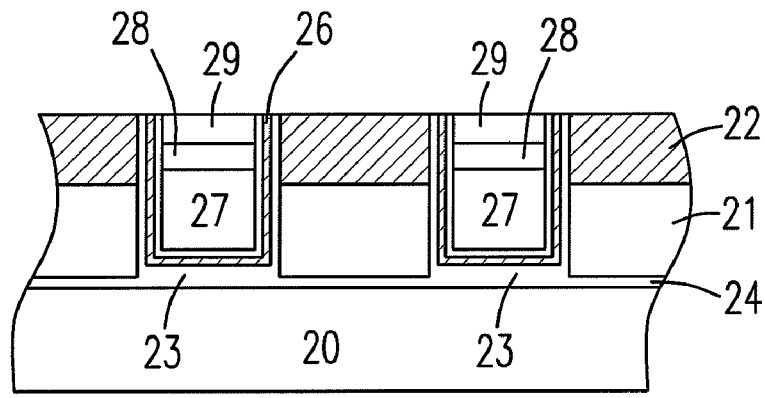
Figure 2J:
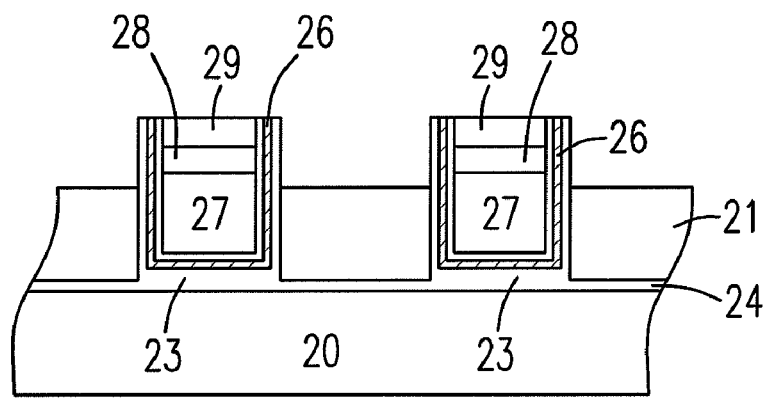
Figure 2K:
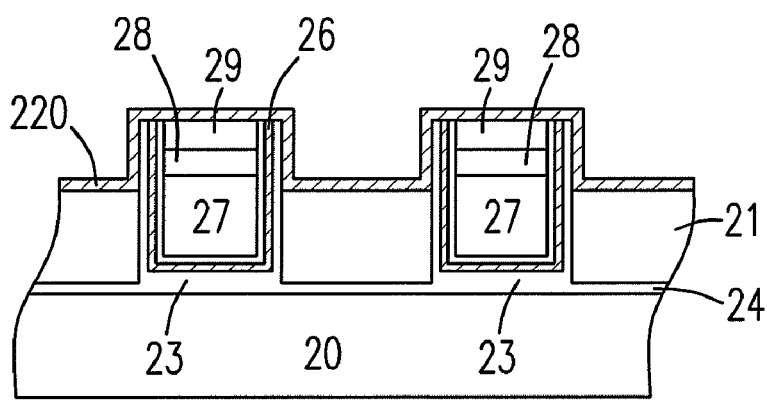
Figure 2L:
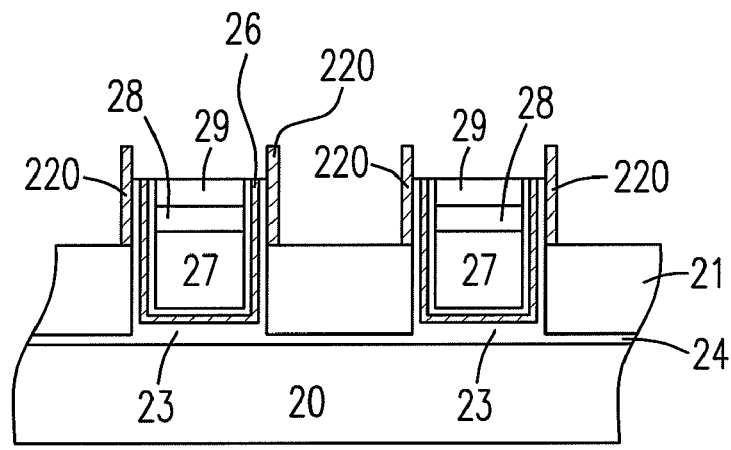
Figure 2M:
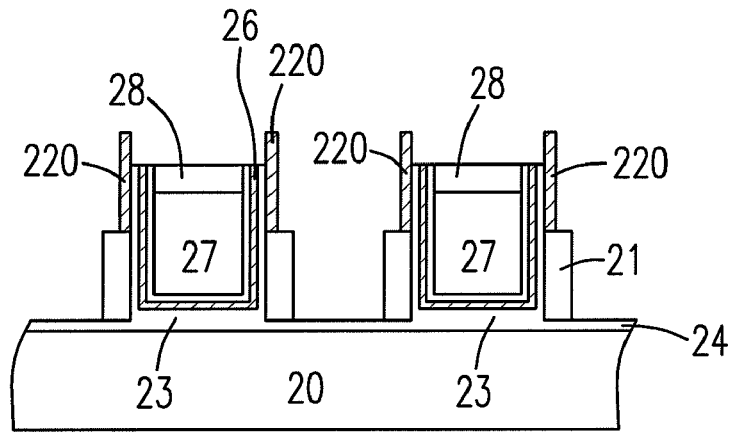

Please refer to FIGS. 2(G) to 2(M). In the above-mentioned embodiment, after the dielectric layer 26 on the spacer layer 22 is removed, steps, which adjust a height of the spacer layer 22, may be performed as follows. A second oxide layer 28 is formed on the first polysilicon layer 27. Afterwards a second polysilicon layer 29 is formed on the second oxide layer 28 and on the spacer layer 22. As shown in FIG. 2(I), a first portion of the second polysilicon layer 29 on the spacer layer 22 is removed by means of polishing, and a second portion of the second polysilicon layer 29 in the trench 25 is merely left on the second oxide layer 28. Afterwards as shown in FIG. 2(J), the spacer layer 22 is etched and removed for exposing the conducting layer 21 and a portion of the dielectric layer 26 on the plural side surfaces 251 of the trench 25, wherein in the present step the spacer layer 22 may be fully removed by means of wet etching. Afterwards as shown in FIGS. 2(K) to 2(M), a silicon nitride layer 220 is formed on the second portion of the second polysilicon layer 29, on the exposed conducting layer 21 and on the exposed portion of the dielectric layer 26. Anisotropic etching is performed to remove a portion of the silicon nitride layer on the second portion of the second polysilicon layer 29 and on the exposed conducting layer 21 and probably adjust a height (thickness) of the silicon nitride layer 220, so that a silicon nitride spacer layer 22 (shown in FIG. 3) is formed to adjust a height of each of the nonvolatile memory cells. Finally the second portion of the second polysilicon layer 29 and the conducting layer 21 are etched for spacing each of the nonvolatile memory cells.

Please refer to FIGS. 2(B) to 2(F) again. A method for making nonvolatile memory cells according to another embodiment of the present invention is described as follows. A semiconductor substrate 20 is provided and at least two spacers are disposed above the semiconductor substrate 20. Each of the at least two spacers may be made of a conducting layer 21 and has a top. A silicon nitride spacer layer 22 is disposed on the top of each of the at least two spacers. A first oxide layer 23 is formed on the semiconductor substrate 20. Afterwards a dielectric layer 26 is formed on the first oxide layer 23 and over the at least two spacers. A first polysilicon layer 27 is formed between the at least two spacers and is etched back for adjusting a height of the first polysilicon layer 27. Finally a first portion of the dielectric layer 26 above the top of the at least two spacers is removed, so that the basic structure of the nonvolatile memory cells of the present invention is formed, wherein the at least two spacers is made into floating gates of the nonvolatile memory cells and the first polysilicon layer 27 is made into control gates of the nonvolatile memory cells.

Please refer to FIGS. 2(G) to 2(M) again. In the above-mentioned embodiment, after the first portion of the dielectric layer 26 above the top of the at least two spacers is removed, steps, which adjust a height of the spacer layer 22, may be performed as follows. A second oxide layer 28 is formed on the first polysilicon layer 27. A second polysilicon layer 29 is formed on the second oxide layer 28 and above the at least two spacers. A first portion of the second polysilicon layer 29 above the at least two spacers is removed and a second portion of the second polysilicon layer 29 on the second oxide layer 28 is remained. The spacer layer 22 is removed and the at least two spacers is etched for exposing a second portion of the dielectric layer 26. A silicon nitride layer 220 is formed above the at least two spacers, on the second portion of the second polysilicon layer 29 and on the exposed second portion of the dielectric layer 26. A portion of the silicon nitride layer above the at least two spacers and the second polysilicon layer 29 is removed. And the second portion of the polysilicon layer 29 and the at least two spacers are etched for spacing each of the nonvolatile memory cells.

Figure 3:
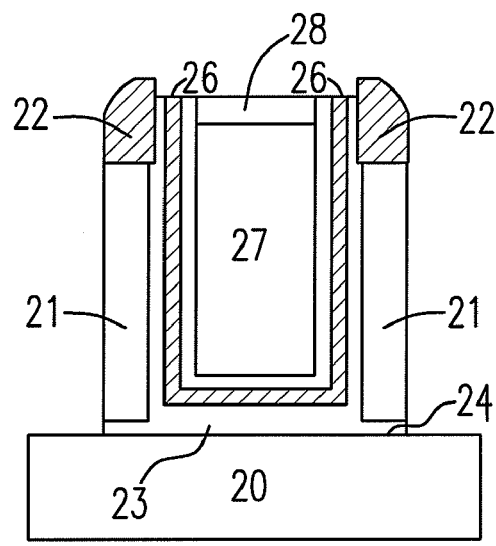
FIG. 3 is a schematic diagram showing a nonvolatile memory cell according to an embodiment of the present invention.

Please refer to FIG. 3, which is a schematic diagram showing a nonvolatile memory cell according to an embodiment of the present invention. The nonvolatile memory cell includes a semiconductor substrate 20, at least two spacers 21, a first oxide layer 23, a first polysilicon layer 27 and a dielectric layer 26. The at least two spacers 21 are disposed above the semiconductor substrate 20. Each of the at least two spacers 21 has a top on which a spacer layer 22 is disposed. The first oxide layer 23 is disposed on the semiconductor substrate 20. The first polysilicon layer 27 is disposed between the at least two spacers 21. The dielectric layer 26 has a first portion disposed between the first oxide layer 23 and a second portion deposed between the at least two spacers 21 and the first polysilicon layer 27.

In the above-mentioned embodiment, the nonvolatile memory cell may further include a second oxide layer 28 and an oxide channel 24. The second oxide layer 28 is disposed on the first polysilicon layer 27, and the oxide channel 24 is disposed between the semiconductor substrate 20 and the at least two spacers 21.

In the above-mentioned embodiment, the spacer layer 22 is made of a silicon nitride. The dielectric layer 26 is an ONO layer. Besides, the at least two spacers 21 may be made of a polysilicon conducting layer and serves as two floating gates of the nonvolatile memory cell, and the first polysilicon layer 27 is a control gate of the nonvolatile memory cell.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A nonvolatile memory cell, comprising:
    a semiconductor substrate;
    at least two spacers disposed above the semiconductor substrate, wherein each of the at least two spacers has a top deposing thereon a spacer layer made of a silicon nitride, and the at least two spacers are floating gates of the nonvolatile memory cell;
    a first oxide layer disposed on the semiconductor substrate;
    a first polysilicon layer disposed between the at least two spacers, wherein the first polysilicon layer is a control gate of the nonvolatile memory cell; and
    a dielectric layer having a first portion disposed between the first oxide layer and the first polysilicon layer, wherein the dielectric layer is an oxide-nitride-oxide layer and has a second portion disposed between the at least two spacers and the first polysilicon layer.

2. A nonvolatile memory cell according to claim 1, further comprising:
    a second oxide layer disposed on the first polysilicon layer.

3. A nonvolatile memory cell according to claim 2, further comprising:
    an oxide channel disposed between the semiconductor substrate and the at least two spacers.

* * * * *